United States Patent
Wu et al.

(10) Patent No.: US 7,279,350 B2
(45) Date of Patent: Oct. 9, 2007

(54) WHITE-LIGHT EMITTING DEVICES AND METHODS FOR MANUFACTURING THE SAME

(75) Inventors: Tung-Hsing Wu, Taichung (TW); Ray-Hua Horng, Taichung (TW); Meng-Chai Wu, Jhubei (TW)

(73) Assignee: AU Optronicscorp, Hsinchu (TW)

( * ) Notice: Subject to any disclaimer, the term of this patent is extended or adjusted under 35 U.S.C. 154(b) by 141 days.

(21) Appl. No.: 11/302,641

(22) Filed: Dec. 14, 2005

(65) Prior Publication Data
US 2006/0160257 A1  Jul. 20, 2006

(51) Int. Cl.
H01L 21/00 (2006.01)
H01L 33/00 (2006.01)

(52) U.S. Cl. .................. 438/35; 438/34; 257/88; 257/89

(58) Field of Classification Search .................. 438/29, 438/32, 34, 35; 257/88, 89, 90, 93; 362/231
See application file for complete search history.

(56) References Cited

U.S. PATENT DOCUMENTS

| | | | | |
|---|---|---|---|---|
| 5,684,309 A * | 11/1997 | McIntosh et al. | ........... | 257/191 |
| 5,952,680 A * | 9/1999 | Strite | ........... | 257/88 |
| 6,395,564 B1 * | 5/2002 | Huang | ........... | 438/7 |
| 6,513,949 B1 * | 2/2003 | Marshall et al. | ........... | 362/231 |
| 6,692,136 B2 * | 2/2004 | Marshall et al. | ........... | 362/231 |
| 6,872,607 B2 * | 3/2005 | Tanaka | ........... | 438/166 |
| 2004/0089864 A1 * | 5/2004 | Chi et al. | ........... | 257/79 |

* cited by examiner

Primary Examiner—Kevin M. Picardat
(74) Attorney, Agent, or Firm—Thomas, Kayden, Horstemeyer & Risley

(57) ABSTRACT

White-light emitting devices and methods for manufacturing the same. The white-light emitting device emits white light comprising a first color component with first wavelength, a second color component with a second wavelength, and a third color component with a third wavelength. The first wavelength is shorter than the second wavelength. The second wavelength is shorter than the third wavelength. The white-light emitting device comprises a baseboard. A first light emitting device emitting the first color component and a second light emitting device emitting a second color component are disposed on the baseboard. A transparent passivation layer with a substantially planar surface is formed on the baseboard. A second light emitting device is disposed on the transparent passivation layer. The second light emitting device emits the third color component which is responsive to the first and the second color components.

11 Claims, 8 Drawing Sheets

… (US 7,279,350 B2)

WHITE-LIGHT EMITTING DEVICES AND METHODS FOR MANUFACTURING THE SAME

This invention relates to concurrently filed, copending U.S. patent application Ser. No. 11/035,647, which has been commonly assigned to the assignee of the present invention.

BACKGROUND

The invention relates to semiconductor opto-electronic devices and fabrication methods thereof, and more particularly, to white light emitting diodes and fabrication methods thereof.

Light emitting diodes (LEDs) are a special type of semiconductor diode first developed in the 1960s. The simplest LED comprises a p-type semiconductor and an n-type semiconductor forming a p-n junction. When an electric current passes through the junction, charge carriers (electrons and holes) are created. In the process, an electron combines with a hole and releases energy in the form of a photon. Most current high efficiency LEDs have one or more layers of light emitting materials sandwiched between the p- and n-type regions to improve the light emitting efficiency. The layer structure is also used to obtain desired emission wavelengths. A basic LED device comprises a small piece of such layered material, called a die, placed on a frame or a baseboard of electrical contacts and mechanical support. The die is also encapsulated for protection.

With an LED, the wavelength of the emitted light is determined by the bandgap energy of the light emitting material. A material suitable for LEDs is a compound semiconductor having bandgap energies corresponding to near infrared (IR), visible or near ultraviolet (UV) light. AlGaInP (Aluminum Gallium Indium Phosphide) is an LED material that exhibits high quantum efficiency (hence high brightness) and multiple colors. The bandgap of $(Al_xGa_{1-x})_{1-y}In_yP$ alloy system varies, depending on the x and y in the composition. The color of AlGaInP LEDs ranges from green to red. AlGaInP LEDs can be fabricated on a lattice-matching gallium arsenide (GaAs) substrate using an exitaxial growth process, such as the metalorganic chemical vapor deposition (MOCVD).

In the 1990s violet, blue and green LEDs based on gallium nitride (GaN) materials were developed. GaN is a direct bandgap semiconductor with bandgap energy of ~3.4 eV. The electron-hole recombination in GaN leads to emission of photons at a wavelength of 360 nm, which is in the UV range. The visible wavelength LEDs (green, blue and red) are achieved by using $In_zGa_{1-z}N$ as the light emitting layer, sandwiched between a p-type GaN layer and an n-type GaN layer. The wavelength λ of the light emitted by the $In_zGa_{1-z}N$ system varies depending on the z value. For example, for pure blue color, λ=470 nm, z=0.2. The GaN LEDs must be fabricated on a lattice-matching substrate such as sapphire or silicon carbide (SiC), again using an epitaxial growth process such as MOCVD.

Great efforts have been made to produce white LEDs capable of replacing conventional lighting sources. Currently, white LEDs can be accomplished in various ways:

(1) Putting discrete red, green and blue LEDs in a "lamp" and use various optical components to mix light in red, green and blue colors emitted by those discrete LEDs. However, due to the different operating voltages for LEDs of different colors, multiple control circuits are required. Furthermore, the lifetime of the LEDs is different from one color to another. Over time the combined color would change noticeably if one of the LEDs fails or degrades.

(2) Partially converting light in short wavelengths to light in the longer wavelengths using phosphors. One of the most common ways is to dispose a yellowish phosphor powder around a blue InGaN LED chip. The phosphor powder is usually made of cerium doped yttrium aluminum garnet (YAG:Ce) crystal. Part of the blue light emitted by the InGaN LED chip is converted to yellow by the YAG:Ce. However, the produced "white" light contains mainly two colors: blue and yellow. Such a light source is usually used as an indicator lamp.

(3) Using UV light produced by very short-wavelength LEDs to excite phosphors of different colors in order to produce light of three colors. The drawback of this method is that the lifetime of the UV LEDs is relatively short. Furthermore, UV radiation from the LEDs can be a health hazard, as most commonly used encapsulation materials are not effective in blocking UV radiation.

There have been numerous attempts to develop white LED light sources with higher efficiency and better chromaticity. Guo et al. ("Photon-Recycling for High Brightness LEDs", Compound Semiconductor 6(4) May/June 2000) discloses the concept of photon recycling in producing high brightness white LEDs. Photo recycling is a process by which short wavelength photons are absorbed by an emitter material, which re-emits photons for long wavelengths. In principle, photon recycling semiconductor (PRS) LEDs can efficiently produce white light of up to 330 lumen/watt. However, the drawback of PRS-LEDs is their extremely low color-rending index.

The dual-color PRS-LED, as disclosed in Guo et al., comprises a primary light source and a secondary light source. The secondary light source has a secondary light emitting layer. The primary light source is used to produce blue light. The produced blue light directed to the secondary emitting layer so that part of the blue light is absorbed in order to produce yellow light in the re-emitting process. In principle, the dual-color photon production in PRS-LEDs is analogous to the phosphor coated LED. However, unlike the phosphor coated LED, the secondary light source comprises a fluorescent semiconductor material, AlGaInP, directly bonded to the primary light source wafer. It is therefore possible to produce dual-color LED chips on a wafer.

FIG. 1 is a cross section of a conventional white light emitting diode device. A white LED device 100 comprises a blue-red dual-color LED 100a and a green-red dual-color LED 100a'. Both LEDs 100a and 100a' are mounted on various electrically conductive sections 172, 174 and 176 on a baseboard 180. LEDs 100a comprise a primary light source 101B emitting blue light and a secondary light source 122a emitting red light which is converted from blue light.

The primary light source 101B comprises a first active layer 114, a hole source layer 112 to provide holes to the active layer 114, and an electron source layer 116 to provide electrons to the active layer 114 so that at least part of the electrons combine with at least part of the holes at the active layer 114 to produce blue light. The secondary light source 122a comprises an AlGaInP layer 122R absorbing part of the blue light of the primary light source 101B and re-emitting red light.

A p-type electric contact 132 of the blue-red color LED 100a electrically contacts the conductive section 172 on the baseboard 180 through conductive material 142. An n-type electric contact 136 of the blue-red color LED 100a electrically contacts the conductive section 174 on the baseboard 180 through conductive material 146. The configuration of the green-red color LED 100a' is similar to the blue-red color LED 100a. Both the blue-red color LED 100a and the green-red color LED 100a' are connected in series. Electrical contacts 152, 156 and wire bonds 162, 166 are further provided on the baseboard 180 to provide an electrical current through the serially connected LEDs.

The conventional white light LED device 100 is formed by wafer bonding. Wafer bonding, however, requires thinning and polishing the sapphire substrate causing high production cost. On the other hand, wafer bonding is an intricate process with production yield issues. Moreover, attaching red epitaxial layer on the GaN LED requires resolving electrode connection issues.

SUMMARY

Accordingly, the invention provides a white-light emitting device combining photo recycling semiconductor light emitting diodes (PRS-LEDs) to emit white light with three primary colors.

The invention also provides a white light emitting device for emitting white-light of at least a first color component with a range of first wavelengths, a second color component with a range of second wavelengths and a third color component with a range of third wavelengths, the first wavelengths shorter than the second wavelengths, the second wavelengths shorter than the third wavelengths. The light emitting device comprises a baseboard. A first light emitting device is disposed on the baseboard. The first light emitting device comprises a first light source for emitting the first color component, and a second light source for emitting the second color component. A transparent passivation layer with a substantially planar surface is disposed overlying the first light emitting device. A second light emitting device is disposed on the substantially planar surface of the transparent passivation layer, wherein the second light emitting device comprises a third light source for emitting the third color component responsive to the first and the second components.

The invention further provides a method of fabricating a white light emitting device for emitting white-light of at least a first color component with a range of first wavelengths, a second color component with a range of second wavelengths and a third color component with a range of third wavelengths, the first wavelengths shorter than the second wavelengths, the second wavelengths shorter than the third wavelengths. The fabrication method comprises forming a first light emitting device on a baseboard, wherein the first light emitting device comprises a first light source for emitting the first color component, and a second light source for emitting the second color component. A transparent passivation layer with a substantially planar surface is deposited overlying the first light emitting device. A second light emitting device is disposed on the substantially planar surface of the transparent passivation layer, wherein the second light emitting device comprises a third light source for emitting the third color component responsive for the first and the second components.

DESCRIPTION OF THE DRAWINGS

The invention can be more fully understood by reading the subsequent detailed description in conjunction with the examples and references made to the accompanying drawings, wherein.

DETAILED DESCRIPTION

In order to achieve the three primary colors of red, green and blue in the white-light source, embodiments of the invention employ low temperatures to package a blue LED and a green LED. A transparent passivation layer with a substantially planar surface is formed overlying the blue LED and the green LED. A red light epitaxial layer on glass is subsequently attached on the transparent passivation layer. As such, the combined light emission contains red light, green light and blue light.

Figure 1:
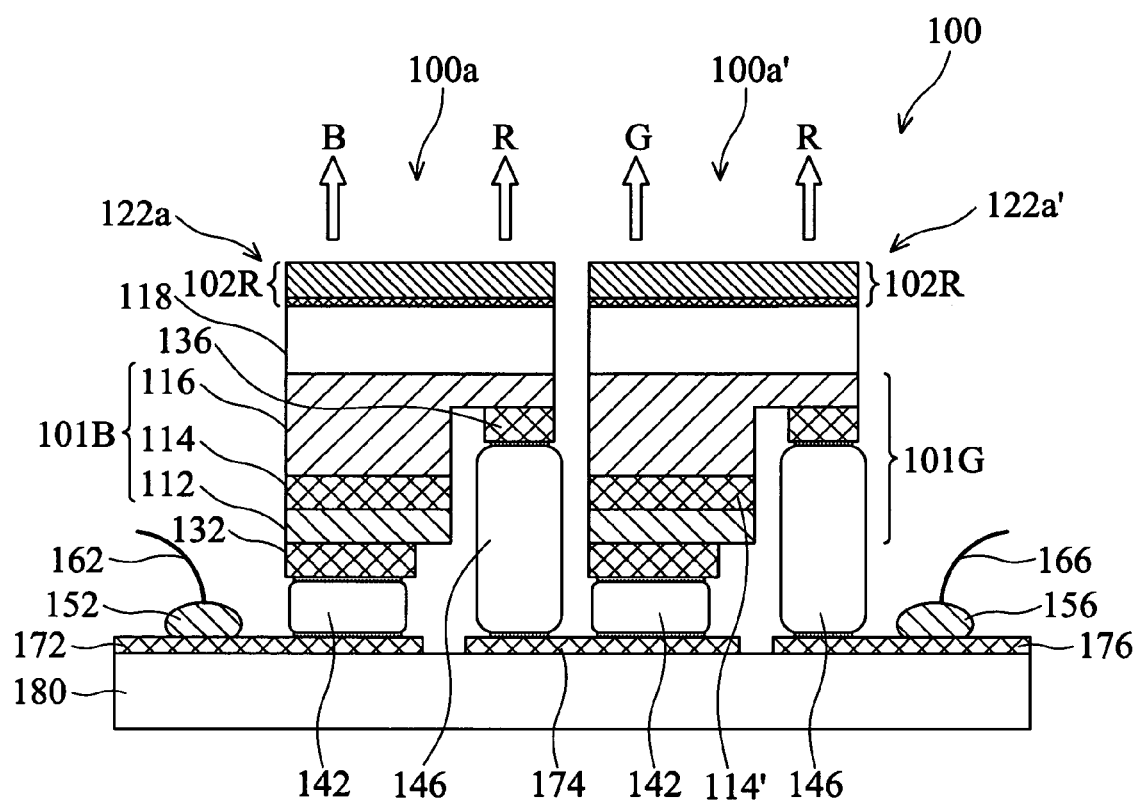
FIG. 1 is a cross section of a conventional white light emitting diode device.
Figure 2:
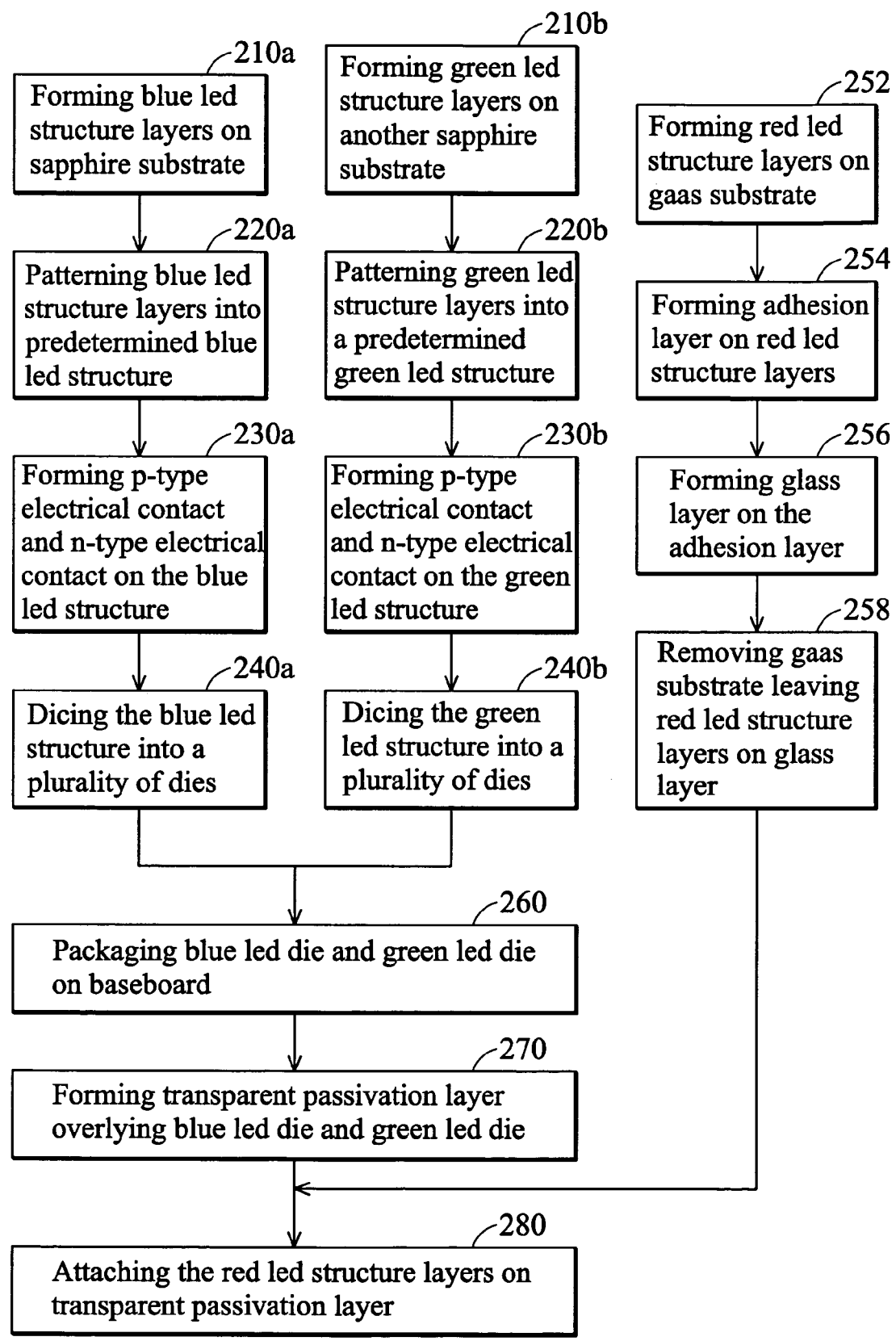
FIG. 2 is a flowchart showing embodiment of fabrication steps of white light emitting diode devices.

FIG. 2 is a flowchart showing embodiment of fabrication steps of white light emitting diode devices. At step 210a, blue LED structure layers are formed on a sapphire substrate. Next, at step 220a, the blue LED structure layers are patterned to form a predetermined blue LED structure. At step 230a, a p-type electrical contact and an n-type electrical contact are formed on the blue LED structure. At step 240a, the blue LED structure is diced into a plurality of dies.

At step 210b, green LED structure layers are formed on another sapphire substrate. Next, at step 220b, the green LED structure layers are patterned to form a predetermined green LED structure. At step 230b, a p-type electrical contact and an n-type electrical contact are formed on the green LED structure. At step 240b, the green LED structure is diced into a plurality of dies.

Subsequently, at step 260, a blue LED die and a green LED die are packaged on a baseboard. Next, at step 270, a transparent passivation layer is formed overlying the blue LED die and the green LED die.

Red LED structure layers are separately formed on a GaAs substrate at step 252. An adhesion layer is subsequently formed on the red LED structure layers at step 254. At step 256, a glass layer is formed on the adhesion layer. The GaAs substrate is removed leaving the red LED structure layers on the glass layer at step 258.

Next, at step 280, the red LED structure layers on glass are attached on the transparent passivation layer. Electrical contacts are provided to connect each LED die.

Figure 3A:
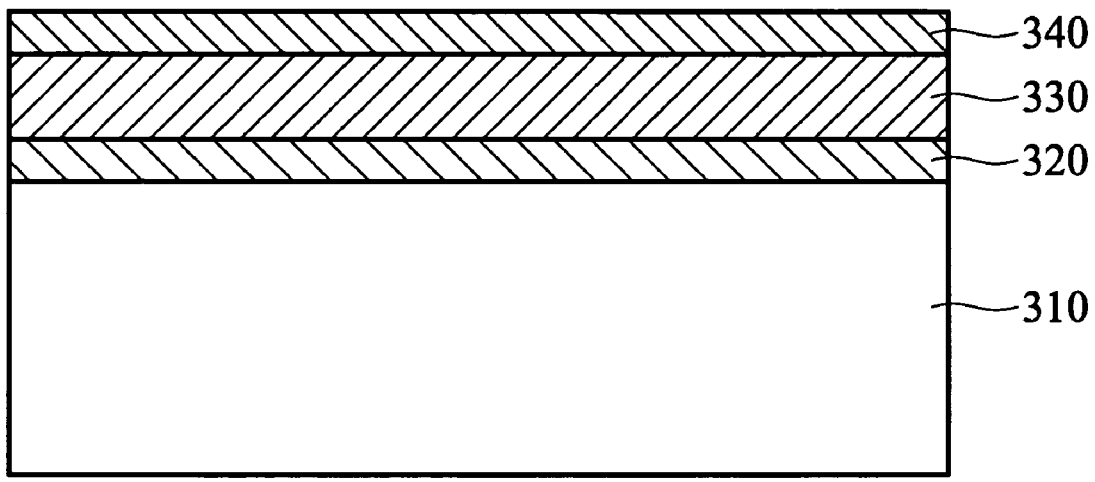
FIGS. 3A-3F are cross sections of an embodiment of fabricating a primary light source structure.

FIGS. 3A-3F are cross sections of an embodiment of fabricating a primary light source structure. Referring to FIG. 3A, various semiconductor material layers are disposed on a transparent substrate for producing a primary light source structure. For example, an n-type GaN layer 320 is epitaxially deposited on a sapphire substrate 310. A blue light emission layer 330 such as an InGaN layer is epitaxially deposited on the n-type GaN layer 320. A p-type GaN layer 340 is epitaxially deposited on the InGaN layer 330.

Figure 3B:
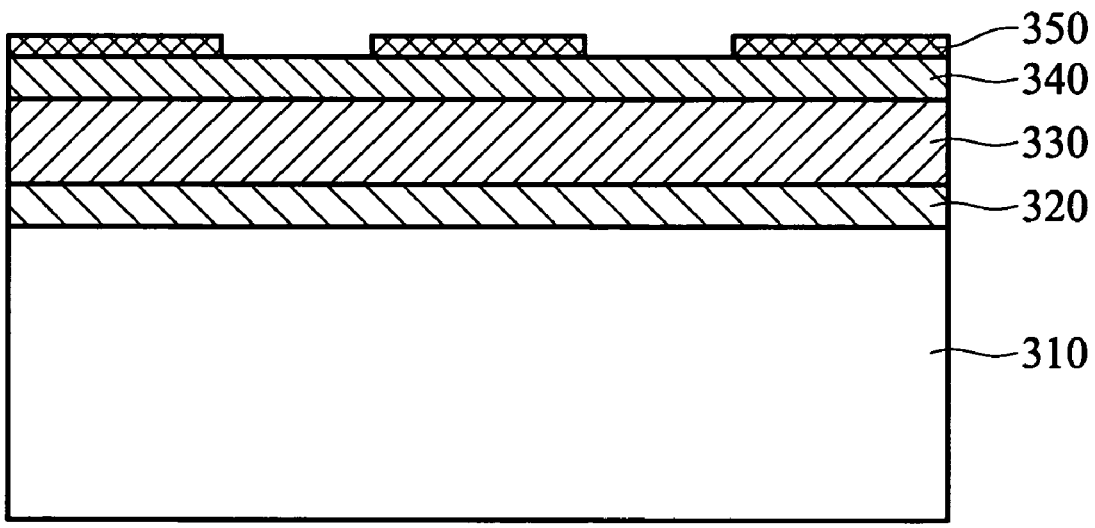

Next, referring to FIG. 3B, a patterned mask 350 is formed on the p-type GaN layer 340. The patterned mask 350 can preferably comprise silicon oxide ($SiO_2$) or silicon nitride.

Figure 3C:
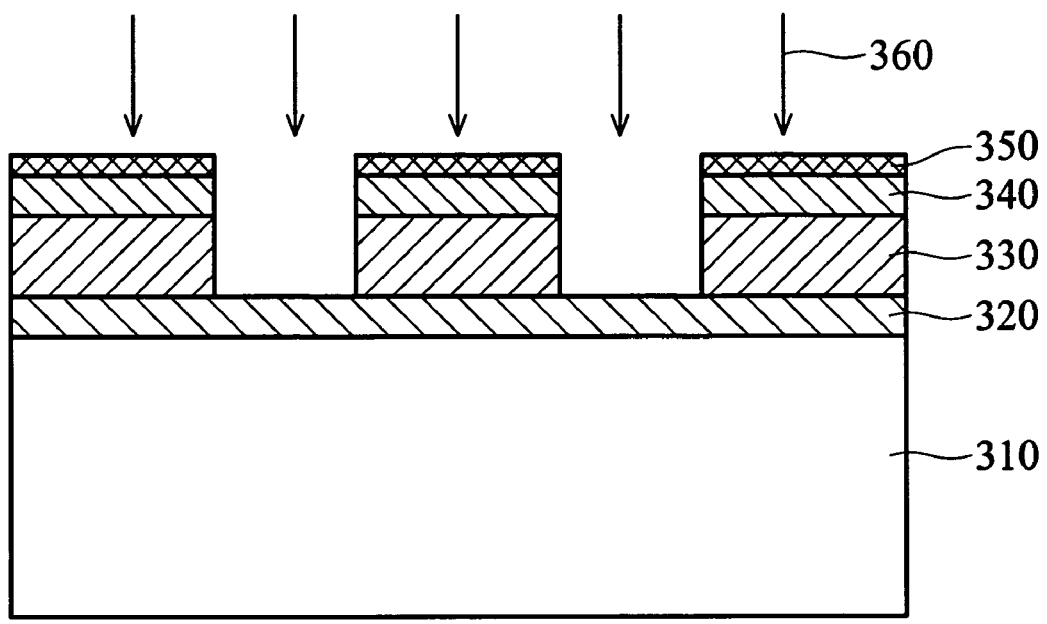
Figure 3D:
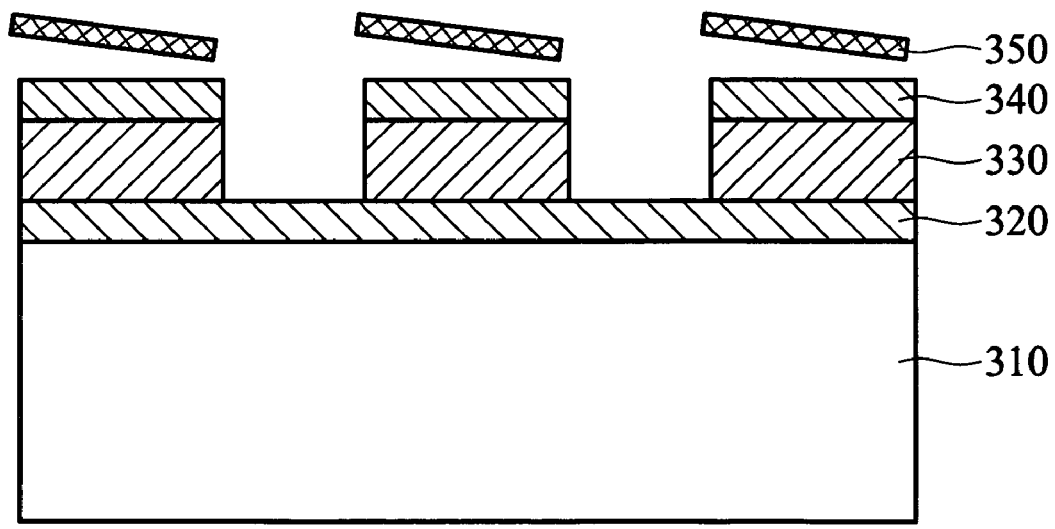

Referring to FIG. 3C, the p-type GaN layer 340 and the InGaN layer 330 are anisotropically etched 360 to create a plurality of discrete blue LED structures. For example, a portion of the p-type GaN layer 340 and the InGaN layer 330 are anisotropically etched by inductively coupled plasma (ICP) etching. Referring to FIG. 3D, the mask 350 is subsequently removed after the ICP etching.

Figure 3E:
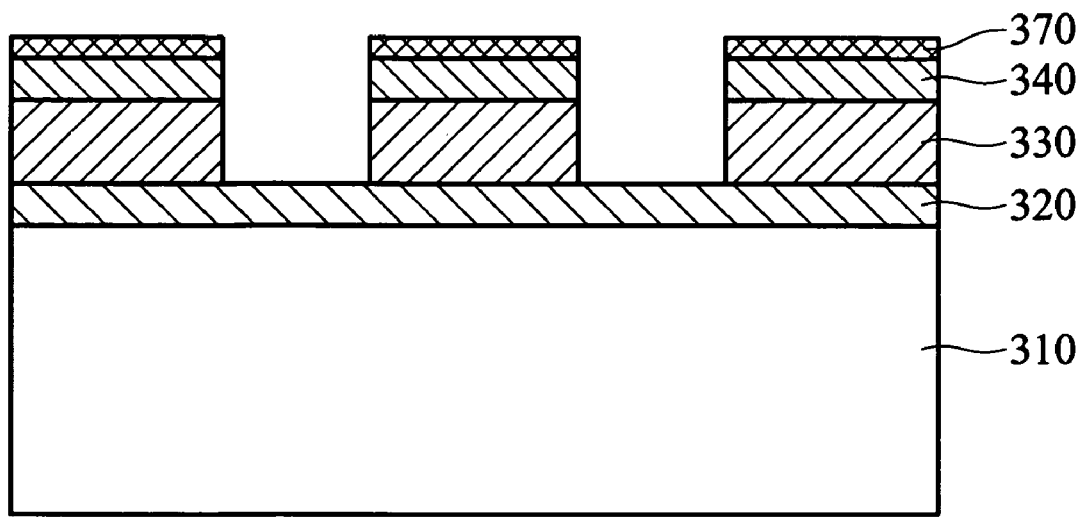
Figure 3F:
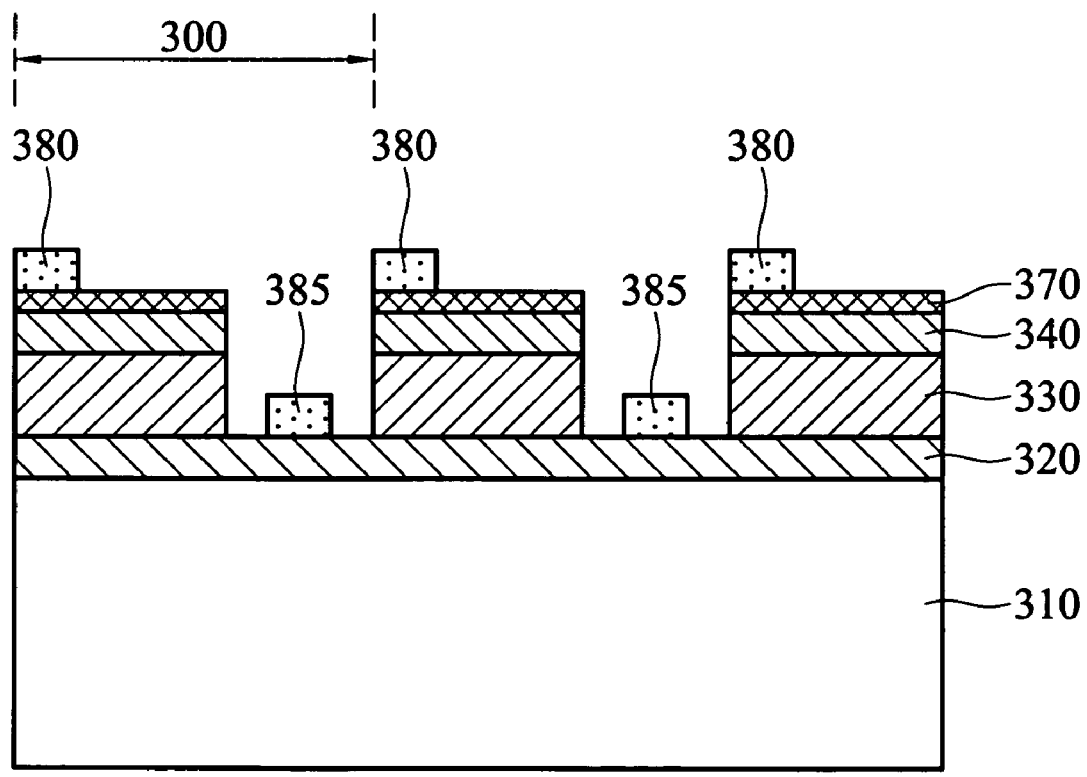

Referring to FIG. 3E, a nickel/aluminum ohmic contact layer 370 is formed on the p-type GaN layer 340. Referring to FIG. 3F, a plurality of electrical contacts 385 are provided on the n-type GaN layer 320, and a plurality of electrical contacts 380 are provided on the p-type GaN layer 340. Next, the blue LED structure is diced into a plurality of dice.

A green LED structure is formed on another sapphire substrate. Note that the fabrication steps of the green LED dice are nearly identical to those of the blue LED dice except a green light emission layer 330'. For simplicity, their detailed description is omitted.

Figure 4A:
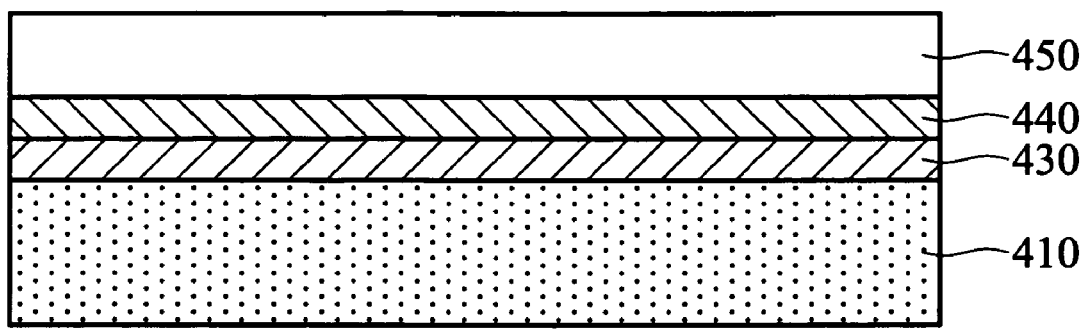
FIGS. 4A-4B are cross sections of an embodiment of fabricating a primary light source structure.
Figure 4B:
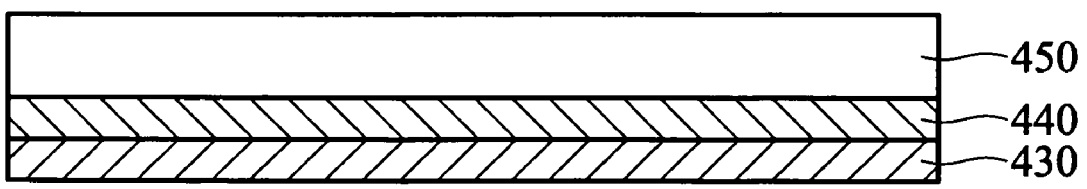

FIGS. 4A-4B are cross sections of an embodiment of fabricating a primary light source structure. Referring to FIG. 4A, an epitaxial layer 430 such as AlGaInP is deposited on a GaAs substrate 410. Next, an adhesion layer 440 is formed on the epitaxial AlGaInP layer 430, and a glass layer 450 is sequentially formed on the adhesion layer 440 using a spin on glass (SOG) method. Referring to FIG. 4B, the GaAs substrate 410 is removed by wet etching using, for example, a $1NH_4OH: 1H_2O_2: 10H_2O$ solution in order to expose the AlGaInP layer 430.

Figure 5:
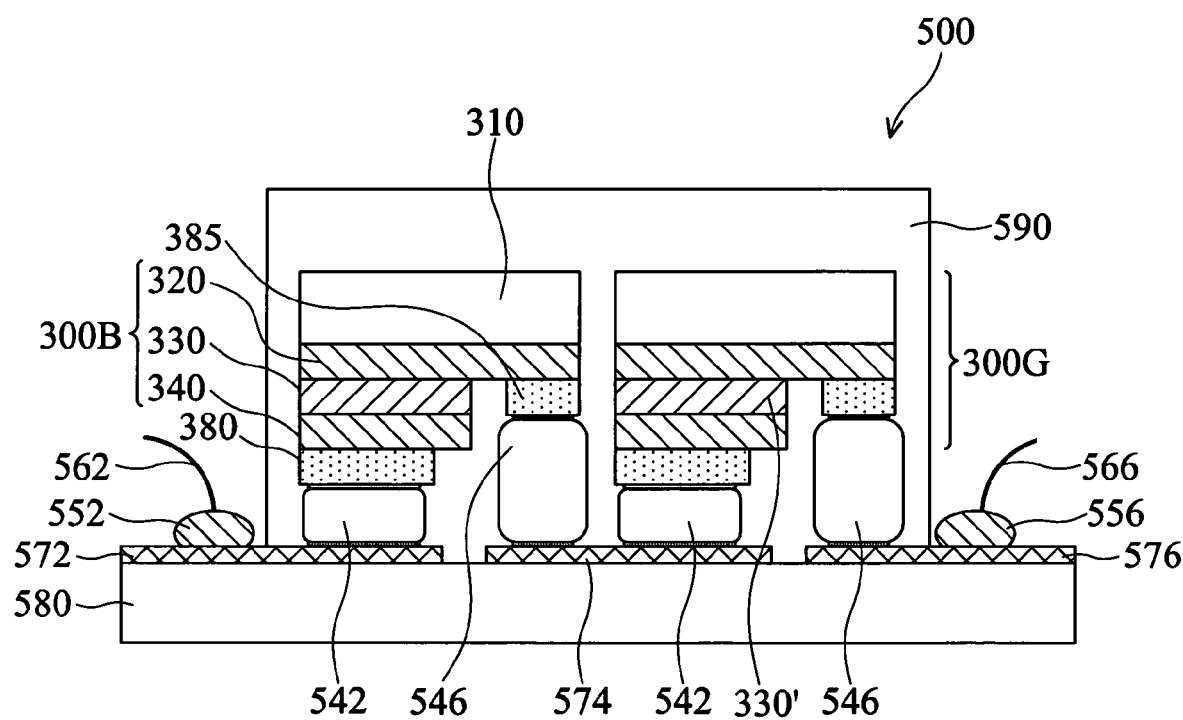
FIG. 5 is a cross section of an embodiment of packaging a blue LED die and a green LED die on a baseboard.

FIG. 5 is a cross section of an embodiment of packaging a blue LED die and a green LED die on a baseboard. A blue LED die 300B and a green LED die 300G are packaged on a baseboard 180. Both LEDs 300B and 300G are mounted on various electrically conductive sections 172, 174 and 176 on the baseboard 180. Electrical contacts 152, 156 and wire bonds 162, 166 are further provided on the baseboard 180 so as to provide an electrical current through the blue LED die 300B and the green LED die 300G connected in series. Next, a transparent passivation layer 590 is formed overlying the blue LED die 300B and the green LED die 300G.

Figure 6:
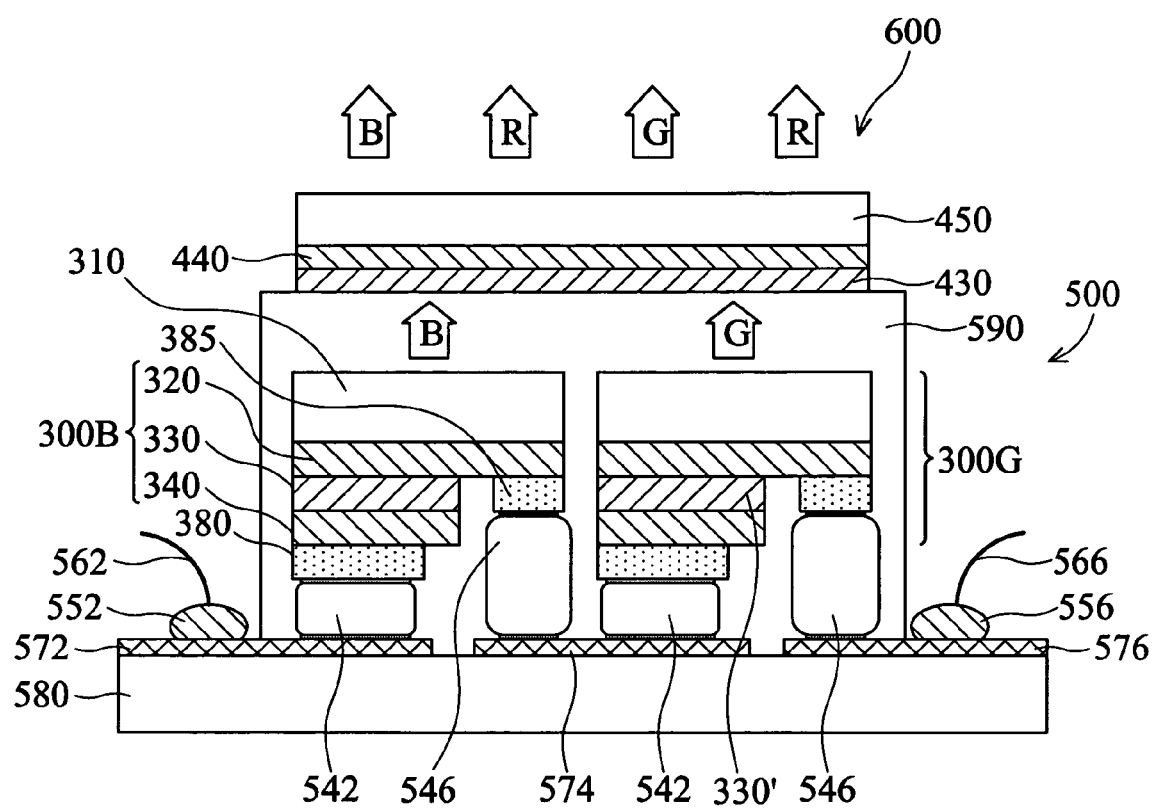
FIG. 6 is a cross section of an embodiment of a white LED device of the invention.

FIG. 6 is a cross section of an embodiment of a white LED device 600 of the invention. The red LED structure on glass (as shown in FIG. 4B) are attached on the transparent passivation layer 590. The AlGaInP layer 430 directly contacts the transparent passivation layer 590. Therefore, a red LED structure is disposed on the transparent dissipation layer 590 with the glass layer 450 at the upper layer of the white LED device 600. Electrical contacts are provided to connect each LED dice.

Note that a first light source 300B of the first LED device structure layers 320, 330 and 340 serve as a blue light LED device. The AlGaInP layer 430 recycles a blue light from the blue light LED device and re-emits red light. Therefore, the AlGaInP layer 430 serves as a second light LED device.

Similarly, a second light-source 300G of the first LED device structure layers 320, 330 and 340 serve as a green light LED device. The AlGaInP layer 430 recycles a green light from the blue light LED-device and re-emits red light. Therefore, the AlGaInP layer 430 serves as a red light LED device.

It will be appreciated by those skilled in the art that the red light emitting layer 430 can comprises $Ga_xIn_{1-x}P$, where $0<x<1$. Furthermore, the p-type GaN layer 340 is a hole source for providing holes to the active layer 330, and the n-type GaN layer 310 is an electron source for providing electrons to the active layer 330. The AlGaN layer can also be used in some cases to replace the p-type GaN layer in the hole source layer and to replace n-type GaN layer in the electron source layer.

In summary, the white-light emitting device of the invention comprises at least one blue-red LEFD and one green-red LED. These LEDs can be electrically connected in series. In one embodiment of the invention, a low temperature process is employed to package a blue LED and a green LED. A transparent passivation layer with a substantially planar surface is formed overlying the blue LED and the green LED. A red light epitaxial layer on glass is subsequently attached on the transparent passivation layer. Note that it is possible to have more than one blue LED die mounted on one white-light emitting device on the baseboard. Similarly, it is possible to have more than one green LED die mounted on one white-light emitting device on the baseboard. The number of the blue or green LED dice in one white-light emitting device partially depends upon the desired white-light intensity and partially upon the relative amount of light components in the RGB light.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A white light emitting device for emitting white-light of at least a first color component with a range of first wavelengths, a second color component with a range of second wavelengths and a third color component with a range of third wavelengths, the first wavelengths shorter than the second wavelengths, the second wavelengths shorter than the third wavelengths, the white light emitting device comprising:

a baseboard;

a first light emitting device, disposed on the baseboard, having a first light source for emitting the first color component, and a second light source for emitting the second color component;

a transparent passivation layer with a substantially planar surface overlying the first light emitting device; and a second light emitting device, disposed on the substantially planar surface of the transparent passivation layer, having a third light source for emitting the third color component responsive to the first and the second components.

2. The white light emitting device as claimed in claim 1, wherein the first light source in the first light emitting device comprises:

a first active layer;

a hole source layer for providing holes to the first active layer; and an electron source layer for providing electrons to the first active layer so that at least part of the electrons combine with at least part of the holes in the first active layer to produce light of the first wavelengths; and wherein the second light source in the first light emitting device comprises:

a second active layer;

a hole source layer for providing holes to the second active layer; and an electron source layer for providing electrons to the second active layer so that at least part of the electrons combine with at least part of the holes in the second active layer to produce light of the second wavelengths.

3. The white light emitting device as claimed in claim 2, wherein:

the first and the second active layers are made substantially from InGaN;

the hole source layer is made substantially from p-type GaN; and the electron source layer is made substantially from n-type GaN.

4. The white light emitting device as claimed in claim 1, wherein the third light source in the second light emitting device is made substantially from AlGaInP.

5. The white light emitting device as claimed in claim 1, wherein the third light source in the second light emitting device is made substantially from $Ga_xIn_{1-x}P$, where $0<x<1$.

6. The white light emitting device as claimed in claim 1, wherein the first color component is a blue color component, the second color component is a green color component, and the third color component is a red color component.

7. A method of fabricating a white light emitting device for emitting white-light of at least a first color component with a range of first wavelengths, a second color component with a range of second wavelengths and a third color component with a range of third wavelengths, the first wavelengths shorter than the second wavelengths, the second wavelengths shorter than the third wavelengths, comprising the steps of:

providing a baseboard;

forming a first light emitting device on the baseboard, the first light emitting device comprising a first light source for emitting the first color component, and a second light source for emitting the second color component;

depositing a transparent passivation layer with a substantially planar surface overlying the first light emitting device; and forming a second light emitting device on the substantially planar surface of the transparent passivation layer, the second light emitting device comprising a third light source for emitting the third color component responsive to the first and the second components.

8. The method of fabricating the white light emitting device as claimed in claim 1, wherein the step of forming the first light source in the first light emitting device comprises:

forming a hole source layer on the baseboard;

forming a first active layer on the hole source layer, wherein the hole source layer provides holes to the first active layer; and forming an electron source layer on the first active layer, wherein the electron source layer provides electrons to the first active layer so that at least part of the electrons combine with at least part of the holes in the first active layer to produce light of the first wavelengths; and wherein the step of forming the second light source in the first light emitting device comprises:

forming a hole source layer on the baseboard;

forming a second active layer on the hole source layer, wherein the hole source layer provides holes to the second active layer; and forming an electron source layer on the second active layer, wherein the electron source layer provides electrons to the second active layer so that at least part of the electrons combine with at least part of the holes in the second active layer to produce light of the second wavelengths.

9. The method of fabricating the white light emitting device as claimed in claim 8, wherein:

the first and the second active layers are made substantially from InGaN;

the hole source layer is made substantially from p-type GaN; and the electron source layer is made substantially from n-type GaN.

10. The method of fabricating the white light emitting device as claimed in claim 7, wherein the third light source in the second light emitting device is made substantially from AlGaInP.

11. The method of fabricating the white light emitting device as claimed in claim 7, wherein the third light source in the second light emitting device is made substantially from $Ga_xIn_{1-x}P$, where $0<x<1$.

* * * * *